United States Patent [19]

Yee

[11] 4,077,035
[45] Feb. 28, 1978

[54] TWO-STAGE WEIGHTED CAPACITOR CIRCUIT FOR ANALOG-TO-DIGITAL AND DIGITAL-TO-ANALOG CONVERTERS

[75] Inventor: Yen Sung Yee, White Plains, N.Y.

[73] Assignee: International Business Machines Corporation, Armonk, N.Y.

[21] Appl. No.: 685,201

[22] Filed: May 10, 1976

[51] Int. Cl.$^2$ .......................................... H03K 13/02
[52] U.S. Cl. ........................ 340/347 DA; 340/347 M; 340/347 AD
[58] Field of Search ................ 340/347 AD, 347 DA, 340/347 M, 347 NT

[56] References Cited

U.S. PATENT DOCUMENTS

| | | | |
|---|---|---|---|
| 2,889,549 | 6/1959 | Caughey | 340/347 M |
| 3,594,782 | 7/1971 | Carbrey | 340/347 DA |
| 3,611,356 | 10/1971 | Jensen | 340/347 DA |
| 3,651,518 | 3/1972 | Carbrey | 340/347 AD |
| 3,653,030 | 3/1972 | Carbrey | 340/347 AD |
| 3,665,458 | 5/1972 | Mulkey et al. | 340/347 DA |
| 3,810,158 | 5/1974 | Murakami et al. | 340/347 DA |
| 3,836,906 | 9/1974 | Ando et al. | 340/347 DA |
| 3,999,123 | 12/1976 | Thoener | 340/347 NT |

OTHER PUBLICATIONS

The Engineering Staff of Analog Devices, Analog--Digital Conversion Handbook, 6/1972, pp. II-46 to II-48, II-58 & III-1 to III-12.

Timbie and Bush, Principles of Electrical Engineering, 1948, J. Wiley & Sons, pp. 310, 311.

Primary Examiner—Thomas J. Sloyan
Attorney, Agent, or Firm—John J. Goodwin

[57] ABSTRACT

A two-stage weighted capacitor network for use as an analog-to-digital or digital-to-analog converter is described. A capacitor ladder is included having two similar groups of capacitors connected in parallel. In each group the parallel capacitors have values starting with value C and decreasing in binary fractional amounts $C/2^1$, $C/2^2$, $C/2^3$, $C/2^4$ etc. to $C/2^{n-1}$. The two groups are interconnected through a coupling capacitor of value $C/2^{n-1}$ and each of the capacitors in the two groups are selectively connected through switches to either a reference voltage or ground potential. A high gain amplifier connected as an inverting amplifier with a 2C capacitor feedback path is connected to the capacitor ladder. When the circuit is used in a digital-to-analog converter, the 2C capacitor is reset and then the digital input pattern, consisting of 2n bits, is manifested by connecting the capacitor ladder switches to the ground potential for "1" bits and leaving the other switches connected to the reference potential for "0" bits. When the circuit is used in an analog-to-digital converter the output of the amplifier is connected to a comparator which serves as a polarity detector and which feeds a set of control logic. The control logic then sets the switches, which were originally all connected to the analog voltage, in a binary search mode.

7 Claims, 2 Drawing Figures

TWO-STAGE WEIGHTED CAPACITOR CIRCUIT FOR ANALOG-TO-DIGITAL AND DIGITAL-TO-ANALOG CONVERTERS

BACKGROUND OF THE INVENTION

1. Field of the Invention

The present invention relates to weighted capacitor circuit for use in digital-to-analog and analog-to-digital converters, and more particularly to a circuit employing two similar stages of weighted capacitors interconnected through a coupling capacitor and in combination with a feedback amplifier.

2. Description of the Prior Art

U.S. Pat. No. 3,890,610 issued June 17, 1975 to Olivier Cahen on a priority application filed Oct. 31, 1972 entitled "High Precision Digital-To-Analog Converters" and assigned to Thomson-CSF relates to a digital-to-analog converter including resistors arranged in a series of ladder networks which correspond to binary digits in combination with feedback amplifier which functions as a low impedance.

U.S. Pat. No. 3,611,356 issued Sept. 17, 1974 to Alan K. Jensen on an application filed Sept. 12, 1969 entitled "Digital-to-Analog Translator" and assigned to Litton Business Systems, Inc. and U.S. Pat. No. 3,836,906 issued Sept. 17, 1974 to Ando et al. on a priority application filed Feb. 28, 1973 entitled "Digital-To-Analog Converter Circuit" and assigned to Sony Corporation are example of converter circuits employing weighted capacitors.

Other references which illustrate the state of the prior art are as follows:

U.S. Pat. No. 3,651,518
U.S. Pat. No. 3,665,458
U.S. Pat. No. 3,906,488

None of the cited references disclose a two-stage weighted capacitor converter according to the principles of the present invention.

SUMMARY OF THE INVENTION

An object of the present invention is to provide a circuit for analog-to-digital and digital-to-analog converters employing a two-stage capacitor network interconnected through a coupling capacitor.

Another object of the present invention is to provide a two-stage weighted capacitor circuit for analog-to-digital and digital-to-analog converters employing a feedback inverting amplifier.

A further object of the present invention is to provide a circuit for digital-to-analog and analog-to-digital converters including a capacitor network where the capacitor sizes vary from 1 to $2^{(n/2-1)}$ for digital signals of n bit length and the area for the capacitors is substantially reduced.

Still another object of the present invention is to provide a circuit for digital-to-analog and analog-to-digital converters which may be fabricated using monolithic metal-oxide-silicon technology and wherein the effect of parasitic capacitance is eliminated.

A further object of the present invention is to provide a circuit for digital-to-analog and analog-to-digital converters featuring high speed bipolar operation wherein no trimming is required.

The foregoing and other objects, features and advantages of the invention will be apparent from the following more particular description of a preferred embodiment of the invention, as illustrated in the accompanying drawings.

DETAILED DESCRIPTION OF THE INVENTION

Figure 1:
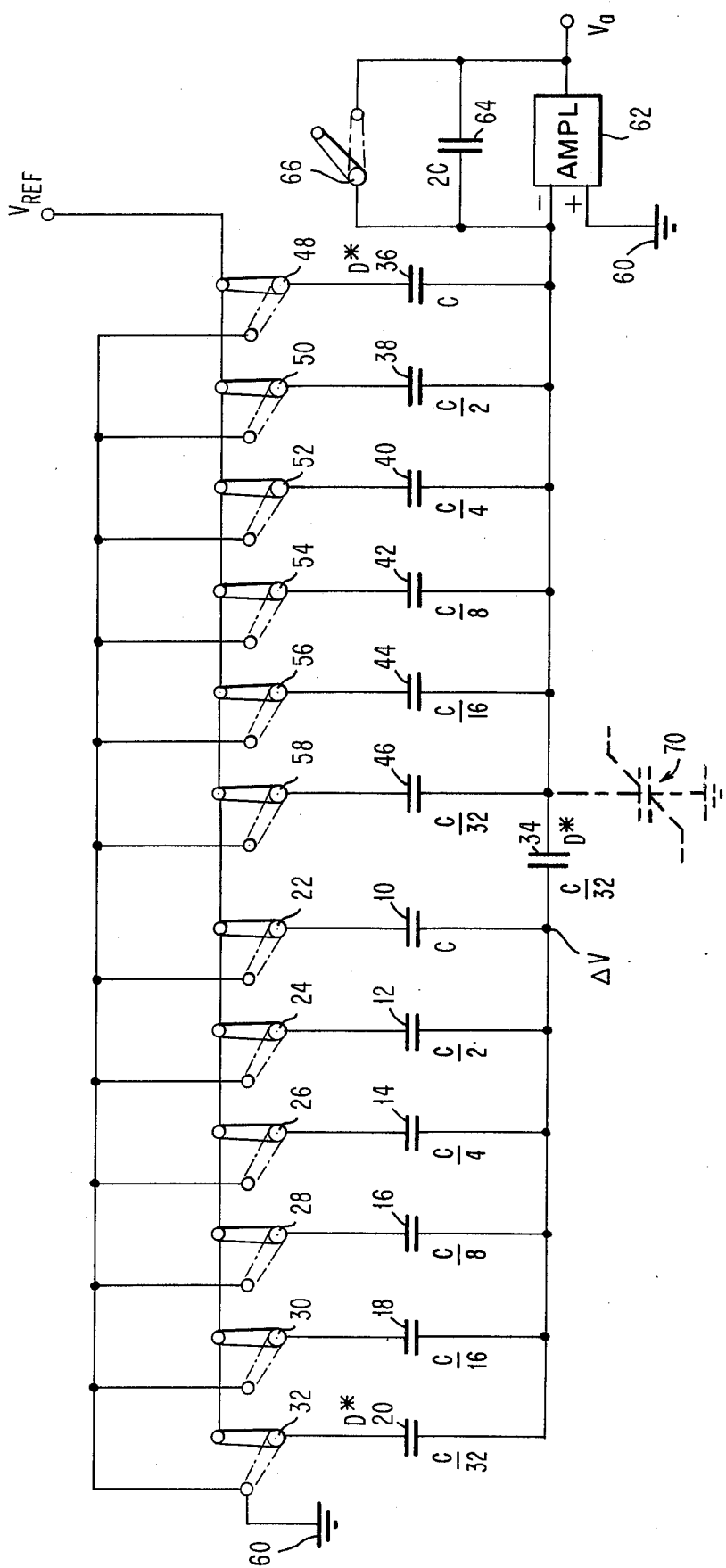
FIG. 1 is a schematic illustration of an embodiment of the circuit of the present invention which may be employed as a digital-to-analog converter.

Referring to FIG. 1, an embodiment of the present invention is illustrated as a digital-to-analog converter. The circuit includes a two-stage capacitor network wherein the two stages contain similar elements. The first stage includes capacitors 10, 12, 14, 16, 18 and 20 each connected on one side to switches 22, 24, 26, 28, 30 and 32 respectively. One advantage of the present invention is that it is possible to fabricate the circuit using monolithic metal-oxide-silicon technology, and in such instances, the diffusion plates (D*) of capacitors 10 through 20 are connected to switches 22 through 32. The other side of each of the capacitors 10 through 20 is connected in common to a series coupling capacitor 34.

In like manner, the other stage of the network includes capacitors 36, 38, 40, 42, 44 and 46 connected to switches 48, 50, 52, 54, 56 and 58 respectively. Capacitors 36, 38, 40, 42, 44 and 46 are connected in common to the diffusion plate (D*) of capacitor 34 and to the input of a high gain amplifier 62.

Switches 22 through 32 and 48 through 58 are arranged so that the diffusion plates of capacitors 10 through 20 and 36 through 46 are connected at one switch position to a source of reference voltage $v_{ref}$ and at a second switch position to ground potential 60.

The switches 22 through 32 and 48 through 58 are shown symbolically as a simple means for indicating a digital signal in terms of switch positions. It should be understood that in practice the digital signal may be electronic and the aforesaid switches may be FETs and may be fabricated within an integrated circuit, for example, with MOS technology.

Amplifier 62 is connected as an inverting amplifier with a feedback capacitor 64 with its diffusion plate connected to the output of amplifier 62. A switch 66 is connected across capacitor 64 and the other input to amplifier 62 is connected to ground potential 60. The output of amplifier 62 is designated $V_a$.

In FIG. 1, there is a switch associated with each binary position of the n-bit digital word to be converted, therefore n is 12 in the present example. Normally, in a weighted resistor or capacitor type converter circuit the range of values for the resistors or capacitors extends from 1 to $2^{n-1}$ for n bits. In the present invention the capacitor range is from 1 to $2^{(n/2-1)}$ thereby improving the resolution of the circuit and substantially reduce the silicon area required for the capacitors. Thus, considering capacitors 10 and 36 or having a value C, the other capacitors in each network decrease in fractional value steps C/2, C/4, C/8 etc. to $C/2^{(n/2-1)}$ which in the present example is $C/2^5 = C/32$. Capacitor 64 has a value 2C and series capacitor 34 has a value C/32.

In operation, switch 66 initially closes to reset capacitor 64, such that it has no net charge prior to a conversion cycle and opens during a conversion cycle. All the switches 22 through 32 and 48 through 58 are connected to reference voltage $V_{ref}$ while switch 66 is closed. Thus, at the beginning of the conversion cycle a charge of $Q = V_{ref} \times C$ is placed on the upper plate of the most significant bit capacitor 36 (capacitor 20 being the least significant bit capacitor). A charge Q/2 is placed on the upper plate of capacitor 38, a charge of Q/4 is placed on the upper plate of capacitor 40 and so on down to capacitor 46 which has a charge of +Q/32 on its upper plate.

At this point it is important to note that the other side of each of the capacitors 36, 38, 40, 42, 44 and 46 are connected at a common node at the input of amplifier 62 and that this common node does not vary in potential and stays tied to zero. Also, the output voltage $V_a$ from amplifier 62 is equal to the voltage across capacitor 64 plus the voltage at the common node which is tied to zero. Thus, the output voltage $V_a$ is equal to the Q transferred across capacitor 64 divided by the value 2C of capacitor 64. Therefore, $V_a = Q$ transferred/2C and the Q transferred is the charge from each of the capacitors 36 through 46 which will be transferred when their associated switches ae moved from $V_{ref}$ to ground 60.

For example, when switch 48 is moved from $V_{ref}$ to ground, charge $Q = V_{ref} \times C$ is transferred across capacitor 64 and $V_a = +Q/2C = V_{ref} \times C/2C = V_{ref}/2$ for the most significant bit position represented by switch 48.

When switch 50 is moved from $V_{ref}$ to ground, the charge transferred is $Q = V_{ref} \times C/2$ and $V_a = V_{ref} \times C/2 \times \frac{1}{2}C = V_{ref}/4$. Likewise when switch 52 is moved from $V_{ref}$ to ground, charge $Q = V_{ref} \times C/4$ is transferred and $V_a = V_{ref} \times C/4 \times \frac{1}{2}C = V_{ref}/8$.

In like manner, when each of the remaining switches 54, 56 and 58 are moved individually from $V_{ref}$ to ground 60, values of $V_a$ equal to $V_{ref}/16$, $V_{ref}/32$ and $V_{ref}/64$ are produced at the output of amplifier 62.

In prior art digital-to-analog converters employing successive approximation, the further increments $V_{ref}/128$, $V_{ref}/256$, $V_{ref}/512$, etc. are produced by selecting capacitors of proportional size such that the total range of the selected capacitors is from 1 to $2^{n-1}$ or from 1 to 2048 in twelve increments where $n$ equals 12. In the present invention, the seventh through twelfth significant bits are manifested using a second capacitor stage wherein the capacitor sizes are again in the range from 1 to $2^{(n/2-1)}$, which in the example of FIG. 1 is C, C/2, C/4, C/8, C/16 and C/32 for capacitors 10, 12, 14, 16, 18 and 20. This means that when switch 22 is moved from $V_{ref}$ to ground the charge transferred must be the same as if capacitor 10 had a value C/64 rather than C in order to produce a value $V_a = V_{ref} = C/64 \times \frac{1}{2}C = V_{ref}/128$.

This is accomplished by virtue of the fact that the input node to amplifier 62 is tied to ground and does not vary in potential. Thus, the capacitors in the right side stage have no effect on the capacitors on the left stage. Now, when switch 22 is moved from $V_{ref}$ to ground, a voltage increment $\Delta V$ is produced and is transferred across capacitor 34. Also, capacitor 34 is in parallel with capacitor 20 to produce a resultant capacitance C/16 which is also parallel with capacitor 18 to produce a resultant capacitance C/8 which is also in parallel with capacitor 16 to produce a resultant capacitance C/4 which, being in parallel with capacitor 14 produces a capacitance C/2, which in parallel with capacitor 12 produces a capacitance C which in parallel with capacitor 10 produces a capacitance of 2C.

Thus, when switch 22 is moved from $V_{ref}$ to ground, the voltage $\Delta V$ across capacitor 34 is $V_{ref} \times C/2C$. $\Delta V$ is therefore equal to $V_{ref}/2$ which is the same as $V_{ref} \times C/64$ in terms of the Q which is transferred to capacitor 64. Consequently, the voltage $V_a$ from amplifier 62 is $V_{ref} \times C/2C \times C/32 \times \frac{1}{2}C = V_{ref}/128$. In like manner it can be shown that the voltage $V_a$ produced when switches 24, 26, 28, 30 and 32 are separately moved from $V_{ref}$ to ground is $V_{ref}/256$, $V_{ref}/512$, $V_{ref}/1024$, $V_{ref}/2048$ and $V_{ref}/4096$ respectively.

Therefore, an analog voltage will be produced for any n bit digital signal ($n = 12$ in FIG. 1) by manifesting the digital signal by moving the associated ones of switches 48 through 58 and 22 through 32 from $V_{ref}$ to ground for "1" bits and leaving the switches associated with digital "0's" connected to $V_{ref}$.

The aforesaid explanation can be expressed mathematically as follows. If the $i^{th}$ bit is a digital "1", the associated $i^{th}$ switch is moved to ground and amplifier 62 integrates the charge due to the coupling into its input node. This results in a positive increment of voltage equal to $V_{ref}(c/2^{i-1})(\frac{1}{2}C) = V_{ref}2^i$ at $V_a$. Thus $$V_a = \sum_{n}^{12} b_i V_{ref}/2^i \qquad \begin{array}{l} b_i = 1, \text{digital ``1''} \\ b_i = 0, \text{digital ``0''} \end{array}$$

It is seen from the previous discussion that the two-stage capacitor network operates to convert a digital signal of n-bits into a corresponding analog signal by employing a total network of capacitors whose values range from 1 to $2^{(n/2-1)}$ rather than 1 to $2^{n-1}$. In the specific embodiment where $n$ is 12, the capacitor range is from 1 to 32 (i.e., C to C/32) rather than from 1 to 2048 (i.e., C to C/2048). In addition to a smaller range offering increased accuracy, the area for the capacitors needed is substantially reduced, which is very important when the converter is embodied as an integrated circuit on a chip.

Also, the capacitors inherently include a diffusion plate, and the diffusion plate to substrate connection acts as a diode which is a non-linear capacitor. This non-linear capacitor is a parasitic capacitance 70, which is depicted by the dotted lines in FIG. 1. However, because the node to which this parasitic capacitor is coupled is fixed and does not move in potential, the parasitic capacitance has no effect. This is another important advantage of the invention.

Figure 2:
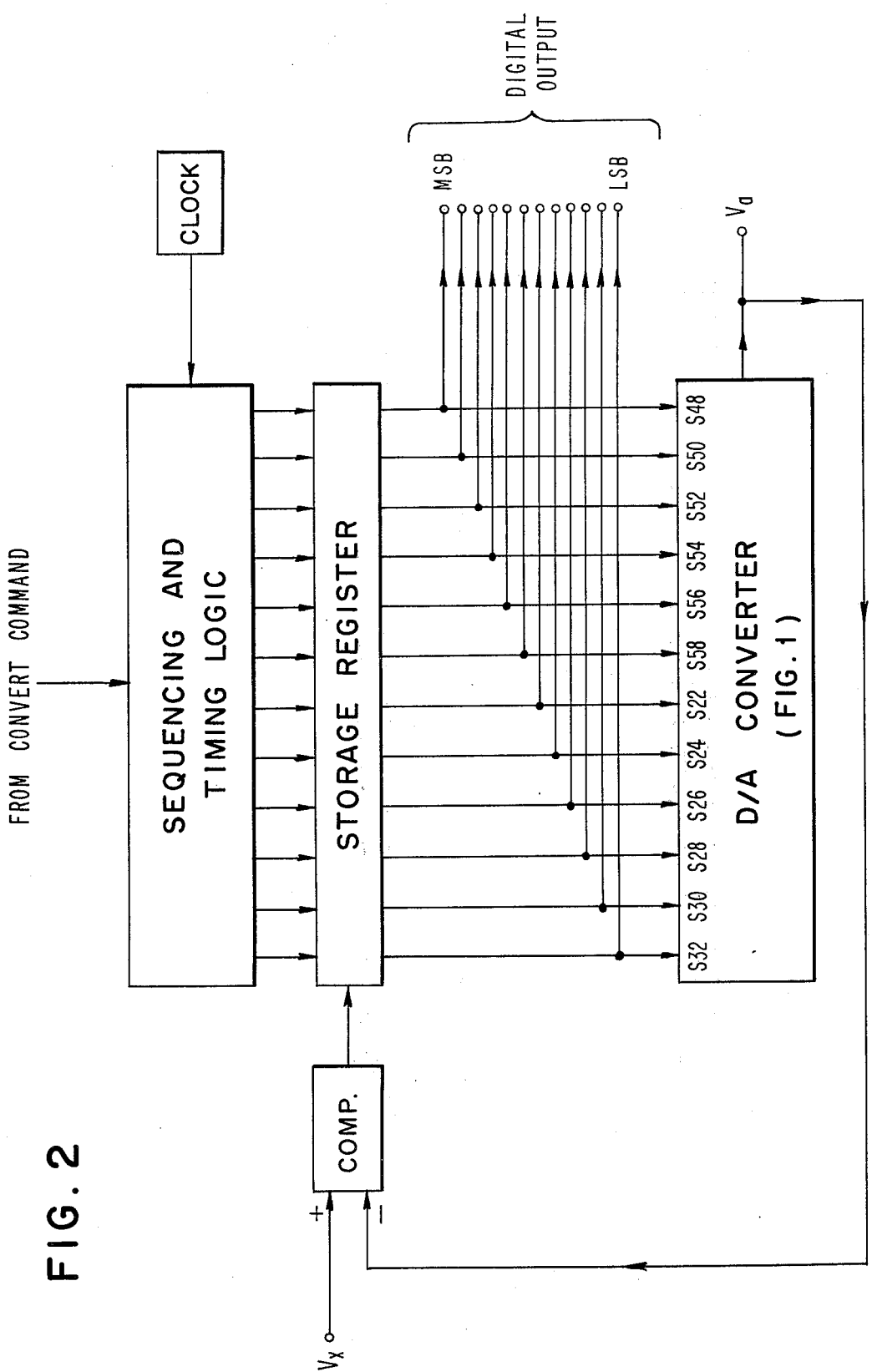
FIG. 2 is a schematic illustration of an embodiment of the circuit of the present invention connected in a combination as an analog-to-digital converter.

The digital-to-analog converter described and illustrated in FIG. 1 can be used as an element in an analog-to-digital converter system as shown in FIG. 2. In FIG. 2 the digital-to-analog converter of FIG. 1 is provided as element 72. The output voltage $V_a$ from converter 72 is connected to a comparator 74 along with the analog signal $V_x$ to be converted. The output of comparator 74 is connected to a storage register 76 having 12 stages, each connected to a separate one of the twelve switches in converter 72. The operation of storage register 76 is controlled by sequencing and timing logic means 78 which is in turn operated by system clock pulses from clock 80 and an input command.

The system of FIG. 2 operates in a binary search mode. Initially capacitor 64 within converter 72 is reset by the closure of switch 66 and all the digital switches 48 through 58 and 22 through 32 are connected to $V_{ref}$. Then all the switches 48 through 58 and 22 through 32 are reconnected to ground potential 60. This switch transistion produces a $V_{ref}$ output potential from amplifier 62 and therefore from the output of converter 72 in FIG. 2. Next, the most significant bit switch 48 is moved from ground potential to $V_{ref}$. This produces a negative voltage $-V_{ref}/2$ which is combined with $V_{ref}$ at the output of amplifier 62 and produces a positive potential $V_{ref}/2$ at the output of converter 72 which is compared with the input analog signal $V_x$ at comparator 74. The output of comparator 74 will be either plus (+) indicating that $V_x$ is greater than $V_{ref}/2$ (i.e. $V_x$ is between $V_{ref}/2$ and full scale $V_{ref}$) or the output will be negative (−) indicating that $V_x$ is less than $V_{ref}/2$ (i.e. $V_x$ is between 0 and $V_{ref}/2$).

If the output from this first comparison is (+), then switch 48 is reconnected to ground potential 60 and next significant bit switch 50 is moved and connected to $V_{ref}$. This produces a negative voltage $-V_{ref}/4$ which is combined at the output of amplifier 62 and produces a positive potential $V_{ref} - V_{ref}/4 = 3V_{ref}/4$ at the output of converter 72, which is used for the second comparison against $V_x$.

If the output from the first comparison was (−), then switch 48 is left in position and next significant bit switch 50 is moved and connected to $V_{ref}$. This produces a negative voltage $-3V_{ref}/4$ which is combined with $V_{ref}$ at the output of amplifier 62 to produce a positive potential $V_{ref} - 3V_{ref}/4 = V_{ref}/4$ at the output of converter 72 which is used for the second comparison. In this manner a sequence of output potentials are produced at the output of converter 72 equivalent to $V_{ref}/2 \pm V_{ref}/4 + V_{ref}/8 \pm V_{ref}/16$ etc. and comparisons are performed until the output of comparator 74 is zero. At this point the switches 48 through 58 and 22 through 32 which are connected to ground potential 60 represent digital "1"s and those connected to $V_{ref}$ represent digital "0"s and the total switch array is the digital representation of the analog input signal $V_x$.

With slight modifications the digital-to-analog converter of FIG. 1 combined in the structure of FIG. 2 can be employed as another analog-to-digital converter which operates in a different mode. One modification is to provide a third contact position for each of the switches 48 through 58 and 22 through 32, with each of the third contacts being connected to the input analog signal $V_x$. The other modification is to have the input lead to comparator 74 in FIG. 2 connected to ground potential rather than to $V_x$.

The mode of operation of this embodiment is that initially the switches 48 through 58 and 22 through 32 are all connected to $V_x$ and are then all switched to ground connection 60. This results in a positive potential of $V_x$ at the output of converter 72. Next, the most significant bit switch 48 is moved to $V_{ref}$ producing a potential of $-V_{ref}/2$ which when combined with $V_x$ at the output of converter 72 produces a resultant potential which is either positive (+) or negative (−) depending on the value of $V_x$ with respect to $V_{ref}/2$ (i.e. either above or below). This output of converter 72 is applied to comparator 74 (the other input of which is ground potential) and comparator 74 operates as a polarity detector.

If the polarity is (+), this is an indication that $V_x$ is between $V_{ref}/2$ and $V_{ref}$ (full scale) but if the polarity is (−) it is an indication that $V_x$ is between $V_{ref}/2$ and ground potential. When a (+) polarity is detected, switch 48 is returned to ground potential and the next significant bit switch 50 is moved to $V_{ref}$. This produces a potential of $-3V_{ref}/4$ which when combined with $V_x$ at the output of converter 72 produces a resultant potential which is either (30) indicating that $V_x$ is greater than $3V_{ref}/4$ or (−) indicating that $V_x$ is greater than $V_{ref}/2$ but below $3V_{ref}/4$. This determination is made in comparator 74.

However when a (−) is initially determined switch 48 is left connected to $V_{ref}$ and switch 50 is also connected to $V_{ref}$ producing a potential of $-3V_{ref}/4$ which when combined with $V_x$ at the output of converter 72 results in a positive potential (+) indicating at comparator 74 that $V_x$ is between $V_{ref}/4$ and $V_{ref}/2$ or a negative potential (−) indicating at comparator 74 that $V_x$ is between ground level and $V_{ref}/4$.

This sequence continues so that $V_x$ is effectively compared with $V_{ref}/2 \pm V_{ref}/4 \pm V_{ref}/8 + V_{ref}/16$ etc. until the output of converter 72 is zero. The particular arrangement of the switches 48 through 58 and 22 through 32 indicate the digital representation of the input analog signal $V_x$. The switches connected to ground potential represent "1" bits and the switches connected to $V_{ref}$ represent "0" bits.

What has been described is a unique circuit which may be employed for digital-to-analog and analog-to-digital conversion. The circuit incorporates two weighted capacitor networks which are connected through a coupling capacitor to a node which is tied to a fixed potential by means of a feedback amplifier. Because of this combination the range of weights required in each capacitor network is smaller than the range that would be required in a single network. This feature reduces the total size of capacitor area required which is a very significant aspect when the circuit is fabricated in MOS technology.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A two-stage weighted capacitor signal conversion circuit comprising a first network of capacitors including a plurality of n/2 capacitors, said capacitors having decreasing fractional values from $C/2°$ to $C/2^{(n/2-1)}$ where n is an integer, an amplifier means including an input and output lead and a feedback capacitor connected between said input and output leads and wherein one side of each of said capacitors of said first network is connected to said amplifier input lead at a first node, a second network of capacitors including a plurality of n/2 capacitors, said capacitors having decreasing fractional values from $C/2°$ to $C/2^{(n/2-1)}$, one side of each of said capacitors of said second network being connected together at a second node, a coupling capacitor of value $C/2^{(n/2-1)}$ connected between said first and second node, a plurality of n switches, each switch connected to the other side of a separate one of said n capacitors of said first and second networks, said switches being adapted to be selectively connected to at least a first reference potential and a second reference potential, wherein said amplifier means functions to maintain said first node constantly fixed at said second reference potential and wherein said plurality of switches are selectively actuated in accordance with a digital signal representation to establish electrical paths through said capacitors connected thereto to provide an analog signal on the otput lead of said amplifier means which is an analog representation of said digital signal representation.

2. A signal conversion circuit according to claim 1 wherein said amplifier means is an inverting amplifier having a second input lead connected to said second reference potential.

3. A signal conversion circuit according to claim 1 wherein said feedback capacitor has a value 2C and includes a reset switch connected across the terminals thereof.

4. A signal conversion circuit according to claim 1 further including a source of input analog signal,
a comparator means connected to said source of said input analog signal and the output lead of said amplifier means and responsive to said analog signal therefrom for comparing said two analog signals and for producing a comparison signal,
storage means connected to said comparator means for storing said comparison signal, said storage means also connected to said plurality of $n$ switches for selectively operating said switches in accordance with said comparison signal for producing a successive analog signal on said amplifier means output lead until the output from said comparator means is zero and said plurality of $n$ switches are set in a digital sequence representative of said input analog signal.

5. A signal conversion circuit according to claim 4 wherein said storage means includes a storage register, a sequencing means connected to said storage register for controlling the operation of said register, and a clock signal means connected to said sequencing means.

6. A signal conversion circuit according to claim 1 further including a source of input analog signal and wherein said plurality of $n$ switches are adapted to be selectively connected to said first reference potential, said second reference potential and to said input analog signal,
a polarity detector means connected to said second reference potential and the output lead of said amplifier means and responsive to said analog signal therefrom for detecting the polarity of said analog signals and for producing an output signal based on said polarity,
storage means connected to said polarity detector means for storing said detector output signal, said storage means also connected to said plurality of $n$ switches for selectively operating said switches in accordance with said polarity detector output signal for producing a successive analog signal on said amplifier means output lead until the output of said amplifer means is zero and said plurality of $n$ switches are set in a digital sequence representative of said input analog signal.

7. A signal conversion circuit according to claim 6 wherein said storage means includes a storage register, a sequencing means connected to said storage register for controlling the operation of said register, and a clock signal means connected to said sequencing means.

* * * * *